(12) United States Patent
Malervy

(10) Patent No.: US 8,790,144 B2
(45) Date of Patent: Jul. 29, 2014

(54) CONTACT ASSEMBLY FOR AN ELECTRICAL CONNECTOR AND METHOD OF MANUFACTURING THE CONTACT ASSEMBLY

(75) Inventor: Elizabeth Sullivan Malervy, Downingtown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 265 days.

(21) Appl. No.: 13/399,528

(22) Filed: Feb. 17, 2012

(65) Prior Publication Data

US 2012/0149257 A1    Jun. 14, 2012

Related U.S. Application Data

(63) Continuation-in-part of application No. 12/794,842, filed on Jun. 7, 2010, now Pat. No. 8,216,006.

(51) Int. Cl.

| | | |
|---|---|---|
| *H01R 13/02* | (2006.01) | |
| *H01R 9/24* | (2006.01) | |
| *C25D 13/02* | (2006.01) | |
| *H01G 4/40* | (2006.01) | |
| *C25D 5/10* | (2006.01) | |
| *C25D 9/04* | (2006.01) | |
| *H01G 4/35* | (2006.01) | |
| *H01G 13/00* | (2013.01) | |
| *H01R 43/16* | (2006.01) | |
| *C25D 13/04* | (2006.01) | |
| *C25D 9/02* | (2006.01) | |
| *C25D 9/08* | (2006.01) | |
| *H01G 4/12* | (2006.01) | |
| *H01R 13/03* | (2006.01) | |
| *C25D 15/02* | (2006.01) | |
| *H01L 49/02* | (2006.01) | |

(52) U.S. Cl.
CPC .................. *C25D 13/02* (2013.01); *H01G 4/40* (2013.01); *C25D 5/10* (2013.01); *C25D 9/04* (2013.01); *H01G 4/35* (2013.01); *H01G 13/00* (2013.01); *H01R 43/16* (2013.01); *C25D 13/04* (2013.01); *C25D 9/02* (2013.01); *C25D 9/08* (2013.01); *H01G 4/1209* (2013.01); *H01R 13/03* (2013.01); *C25D 15/02* (2013.01); *H01L 28/40* (2013.01)
USPC ............................................ 439/886; 29/874

(58) Field of Classification Search
CPC ............ C25D 5/10; C25D 9/04; C25D 13/02; C25D 13/04; C25D 9/02; C25D 9/08; C25D 15/02; H01G 4/35; H01G 13/00; H01G 43/16; H01G 4/1209; H01G 4/40; H01G 13/03; H01G 28/40; H01G 23/688; H01G 13/02
USPC .......... 439/886, 887, 620.12, 620.09, 620.16; 29/874
See application file for complete search history.

(56) References Cited

U.S. PATENT DOCUMENTS

| | | | |
|---|---|---|---|
| 2,843,541 | A | 7/1958 | Senderoff et al. |
| 4,584,074 | A | 4/1986 | Sterling et al. |
| 5,003,428 | A | 3/1991 | Shepherd |
| 5,414,220 | A | 5/1995 | Hanato et al. |
| 7,256,983 | B2 | 8/2007 | Ozawa et al. |
| 7,540,781 | B2 | 6/2009 | Kenny et al. |
| 8,157,598 | B2 | 4/2012 | Niitsu |
| 2003/0151032 | A1 | 8/2003 | Ito et al. |
| 2009/0301770 | A1 | 12/2009 | Cho et al. |
| 2011/0230096 | A1 | 9/2011 | Atkinson et al. |
| 2012/0314339 | A1* | 12/2012 | Sullivan et al. ............ 361/321.1 |

FOREIGN PATENT DOCUMENTS

| | | |
|---|---|---|
| CN | 1455933 A | 11/2003 |
| EP | 0645849 A2 | 9/1994 |
| EP | 2261400 A1 | 12/2010 |
| GB | 2117796 A | 10/1983 |
| GB | 2150153 A | 6/1985 |
| GB | 2158463 A | 11/1985 |

| WO | WO-2005/100642 A1 | 10/2005 |

OTHER PUBLICATIONS

Ranjbar Z et al: "Morphology and electrical conductivity behavior of electro-deposited conductive carbon black-filled epoxy dispersions near the insulator-conductor transition point." Colloids and Surfaces. A., Physiochem. Eng. Aspects, Elsevier, Amsterdam, NL, vol. 290, No. 1-3, Nov. 15, 2006, pp. 186-193.

PCT International Search Report issued in related PCT Application No. PCT/US2013/023760 on Apr. 29, 2013.

European Search Report for European Application No. EP-10165429, mailed on Sep. 30, 2010.

\* cited by examiner

*Primary Examiner* — Javaid Nasri

(57) ABSTRACT

A contact assembly includes a conductive substrate, a composite layer, and a conductive layer. The conductive substrate is configured to form a conductive path of the electrical connector. The composite layer is engaged to the conductive substrate and includes a dielectric material with a conductive filler material dispersed within the dielectric material at a concentration that is lower than a percolation threshold concentration of the composite layer. The conductive layer is engaged to the composite layer. The conductive substrate, the composite layer, and the conductive layer form a capacitive element through which a signal propagation path between the conductive substrate and a mating contact that mates with the conductive layer passes.

22 Claims, 6 Drawing Sheets

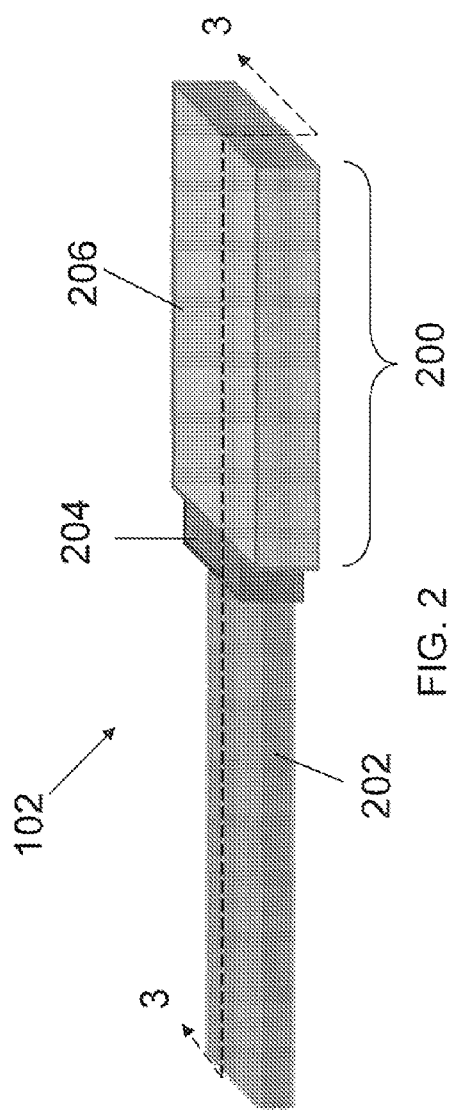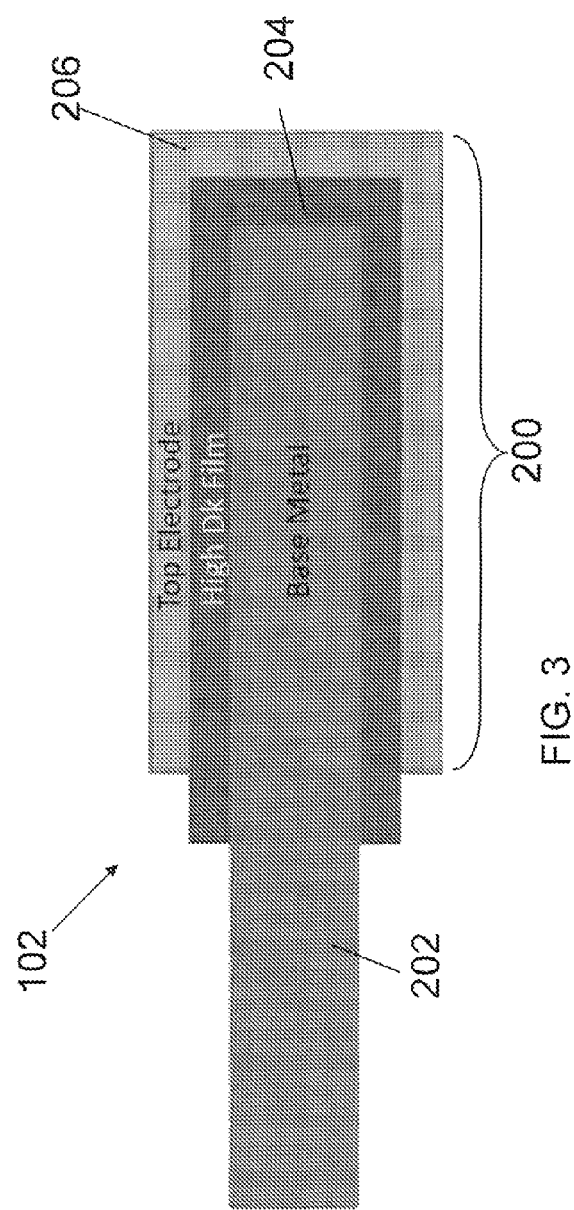

CONTACT ASSEMBLY FOR AN ELECTRICAL CONNECTOR AND METHOD OF MANUFACTURING THE CONTACT ASSEMBLY

CROSS-REFERENCE TO RELATED APPLICATIONS

This application is a continuation-in-part of U.S. patent application Ser. No. 12/794,842, which was filed on 7 Jun. 2010 (the "'842 application"). The entire disclosure of the '842 application is incorporated by reference.

BACKGROUND

One or more embodiments of the subject matter described herein generally relate to the deposition of dielectric and/or polymer materials onto a conductive substrate to form composite assemblies for electrical connectors.

Growing demands for miniaturization, improved performance, and reduced cost and weight of electronic components has driven intense research for novel materials and manufacturing processes to meet these demands. In order to improve signal quality in high speed electrical connectors, capacitive elements may be included along or near the signal path in the connector and/or at a mating interface between the connector and another mating connector. For example, some known connectors are mounted onto circuit boards with capacitors mounted onto the printed circuit board adjacent to the connectors and along the signal path extending from the connector and through the circuit board. Adding discrete capacitors to circuit boards, however, consumes additional real estate of the limited available surface area on the circuit board.

Other known connectors include a separate, discrete capacitor that is coupled to the signal paths in the connectors using known manufacturing methods, such as solder. Joining a separate capacitor to the signal path, however, may lead to problems in matching the electrical impedance of the signal path with the impedance through the capacitor and circuit board. Additionally, solder may introduce risks of reliability concerns as the joint between the solder and the signal path of the connectors can be brittle and easy to break. Additional methods to attach a discrete capacitor to the connector, such as epoxy application, present problems with adhesion, leading to fracture and cracking of the joint.

Some known capacitive elements are created by covering a conductive tape with a thin film of dielectric material. Adhesion of the dielectric material to the conductive tape is generally poor, thereby resulting in delamination of the dielectric material from the conductive tape. Additionally, the dispersion of the dielectric material on the tape may be uneven, resulting in an inhomogeneous dispersion of the dielectric material on the tape. This may result in non-uniform signal integrity across the connector.

Other capacitive elements may be created using processing techniques that involve relatively expensive processes and relatively high processing temperatures in order to get dielectric materials with relatively high dielectric constants to adhere to conductive bodies. For example the application of traditional high Dk materials and/or precursors—such as barium titanate, strontium titanate, tantalum oxides, and lead-based metal oxides—may require annealing temperatures well above the anneal temperature of the base metal of the connector. These processes may also result in relatively poor adhesion between the dielectric materials and the conductive bodies.

BRIEF DESCRIPTION

In one embodiment, a contact assembly for an electrical connector includes a conductive substrate, a composite layer, and a conductive layer. The conductive substrate is configured to form a conductive path of the electrical connector. The composite layer is engaged to the conductive substrate and includes a dielectric material with a conductive filler material dispersed within the dielectric material at a concentration that is lower than a percolation threshold concentration of the composite layer. The conductive layer is engaged to the composite layer. The conductive substrate, the composite layer, and the conductive layer form a capacitive element through which a signal propagation path between the conductive substrate and a mating contact that mates with the conductive layer passes.

In another embodiment, another contact assembly is provided. The contact assembly includes a conductive substrate, a composite layer, and a conductive layer. The conductive substrate is configured to form a conductive path of the electrical connector. The composite layer is engaged to the conductive substrate and includes a dielectric material with a conductive filler material dispersed within the dielectric material at a concentration that is lower than a percolation threshold concentration of the composite layer. The conductive layer is engaged to the composite layer. The conductive substrate, the composite layer, and the conductive layer filter data signals that are communicated between the conductive substrate and a mating contact that mates with the conductive layer.

In another embodiment, a method is provided and includes providing a fluid bath that includes a dielectric material, adding a conductive filler material to the fluid bath, inserting a conductive substrate into the fluid bath to deposit a composite layer formed from the dielectric material and the conductive filler onto the conductive substrate, and depositing a conductive layer on the composite layer. The conductive substrate, the composite layer, and the conductive layer form a capacitive element through which a signal propagation path between the conductive substrate and a mating contact that mates with the conductive layer passes. The conductive filler material is added to the fluid bath such that a concentration of the conductive filler in the deposited composite layer is lower than a percolation threshold concentration of the composite layer.

BRIEF DESCRIPTION OF THE DRAWINGS

FIG. 2 is a perspective view of a contact assembly shown in FIG. 1 in accordance with one embodiment.

FIG. 3 is a cross-sectional view the contact assembly shown in FIG. 2 along line 3-3 in FIG. 2.

DETAILED DESCRIPTION

Figure 1:
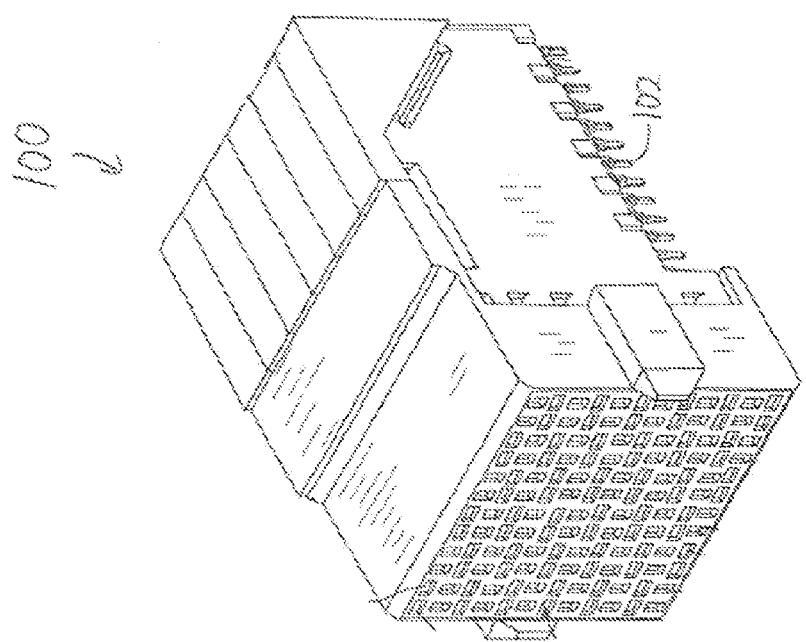
FIG. 1 is a perspective view of an electrical connector in accordance with an example of one embodiment.

FIG. 1 is a perspective view of an electrical connector 100 having composite assemblies as contact assemblies 102 in accordance with an example of one embodiment. The connector 100 is used to illustrate merely one example of a wide variety of devices that may incorporate one or more embodiments of the subject matter described herein. The connector 100 depicted in FIG. 1 is not intended to limit all embodiments described herein to the connector 100.

The connector 100 includes several contact assemblies 102. The contact assemblies 102 include conductive materials and provide conductive paths for the connector 100 to convey electric current. For example, the contact assemblies 102 may be signal contacts that communicate electronic data signals with a circuit board (not shown) or another connector, ground contacts that electrically join an electromagnetic shield of the connector 100 with a ground reference, power contacts that transmit electric power to and/or from the connector 100, and the like. In accordance with one embodiment, the contact assemblies 102 are capacitive contacts.

FIG. 2 is a perspective view of one of the contact assemblies 102 in accordance with one embodiment. FIG. 3 is a cross-sectional view of the contact assembly 102 shown in FIG. 2 along line 3-3 in FIG. 2. The contact assemblies 102 may be multi-layered capacitive contacts formed from capacitive assemblies 200. For example, the contact assemblies 102 may have integrated or inherent capacitive members formed by conductive and composite layers or bodies. The capacitive assembly 200 includes a conductive substrate 202 ("Base Metal" in FIG. 3) and a conductive layer 206 ("Top Electrode" in FIG. 3) separated by a composite layer 204 ("High Dk Film" in FIG. 3). The conductive substrate 202 and/or conductive layer 206 include or are formed from conductive materials such as a metal, metal alloy, or conductive carbon-based materials. For example, the conductive substrates 202 may be formed from copper (Cu) or a copper alloy. Alternatively, the conductive substrates 202 and/or conductive layer 206 may be formed from one or more other conductive bodies.

The composite layer 204 is provided on the conductive substrate 202, and the conductive layer 206 is provided on the composite layer 204. The composite layer 204 may be or include a material that has a relatively high dielectric constant (Dk). For example, the composite layer 204 can include or be formed from one or more materials having a dielectric constant (Dk) that is greater than 3.0. Alternatively, the dielectric constant (Dk) of the material(s) in the composite layer 204 may be at least 4.2. In another example, the dielectric constant (Dk) of the material(s) in the composite layer 204 may be at least 100. In another example, the composite layer 204 can include or be formed from one or more conductive materials and one or more dielectric materials. Such materials may be referred to herein as "high-dielectric materials." Alternatively, the composite layers 204 may have materials with lower dielectric constant (Dk). For example, the composite layers 204 may have a dielectric constant (Dk) of 3.0 or less.

As described below, the composite layers 204 include a dielectric material with a conductive filler material dispersed therein. The concentration of the conductive filler material can be varied in the dielectric material in order to control the overall dielectric constant (Dk) of the composite layer 204. In one embodiment, the concentration of the conductive filler material is below a percolation threshold concentration, as described below.

The composite layer 204 can be applied to the conductive substrate 202 in one or more ways. In one embodiment, the composite layer 204 is electrodeposited, or "electrocoated" or "e-coated," onto one or more of the conductive substrate 202. For example, the composite layer 204 may be deposited on the conductive substrates 202 by electrodepositing the dielectric material onto the conductive substrate 202 or by co-electrodepositing the dielectric material and a filler material onto the conductive substrate 202. In another embodiment, the composite layer 204 is deposited by a chemical reaction of the reactive precursor materials. The reactive precursor materials react on or at the surface of the conductive substrate 202. The reaction causes the composite layer 204 to be deposited on the conductive substrate 202.

As another example, the composite layer 204 may be provided in a fluid or liquid state in a suspension, mixture, or solution, and the conductive substrate 202 may be dip-coated with the composite layer 204. For example, the conductive substrate 202 may be entirely or partially submerged in a fluid bath of the materials used to form the composite layer 204. The conductive substrate 202 may be removed from the bath then allowed to cure, dry, harden, or otherwise change states to a solid state as the composite layer 204 on the conductive substrate 202.

In another embodiment, the composite layer 204 may be laminated onto the conductive substrate 202. For example, the composite layer 204 may be formed as a sheet, tube, or other shape that is adhered to the outer surface of the conductive substrate 202. An adhesive material may be applied between the composite layer 204 and the conductive substrate 202 and/or the composite layer 204 may be heated to assist with adhering the composite layer 204 to the conductive substrate 202.

As another example, the composite layer 204 may be screen printed onto the conductive substrate 202. For example, the composite layer 204 may be provided in a fluid or liquid state in a suspension, mixture, or solution and printed onto the outer surface of the conductive substrate 202. The composite layer 204 is then allowed to cure, dry, harden, or otherwise change states to a solid state on the conductive substrate 202.

Alternatively, the composite layer 204 may be extruded or molded into a shape that fits over the conductive substrate 202, or that the conductive substrate 202 fits into. For example, the composite layer 204 can be formed as a solid body, such as a tube, that defines an interior chamber. The conductive substrate 202 can then be inserted into the interior chamber. In one embodiment, the composite layer 204 is extruded or molded into a shape that engages the outer surface of the conductive substrate 202, such as by having an interior chamber that snap fits or has a very close fit to the outer surface of the conductive substrate 202.

As another example, the composite layer 204 may be provided in a fluid or liquid state (e.g., molten), and the materials of the composite layer 204 may be sprayed onto the conductive substrate 202. For example, the conductive substrate 202 may be sprayed with an aerosol or other dispersion of the materials used to form the composite layer 204. The materials of the composite layer 204 may be removed from the bath or aerosol medium to allow the material to cure, dry, harden, or otherwise change states to a solid state to form the composite layer 204 on the conductive substrate 202.

In another embodiment, the composite layer 204 may be spin coated onto the conductive substrate 202. For example, the composite layer 204 may be applied to a portion of the conductive substrate 202 when the materials forming the composite layer 204 are in a fluid state. The conductive substrate 202 may be moved (e.g., spun) to cause the fluid materials of the composite layer 204 to move on and coat at least a portion of the conductive substrate 202. The fluid materials may then cure, dry, harden, or otherwise change states to a solid state to form the composite layer 204 on the conductive substrate 202.

In another example, the composite layer 204 may be provided on the conductive substrate 202 using physical vapor deposition (PVD). The materials that form the composite layer 204 may be provided in a vaporized form inside a chamber. The conductive substrate 202 may be loaded into the chamber so that the vaporized materials coat at least a portion of the conductive substrate 202. The materials may then cure, dry, harden, or otherwise change states to a solid state to form the composite layer 204 on the conductive substrate 202.

The conductive layer 206 may be provided on the composite layer 204 by depositing conductive material (e.g., metal, metal alloys, or conductive carbon) onto the composite layer 204. In one embodiment, the conductive layer 206 can be sputtered onto or electrodeposited onto the composite layer 204. Alternatively, another technique may be used.

Figure 4:
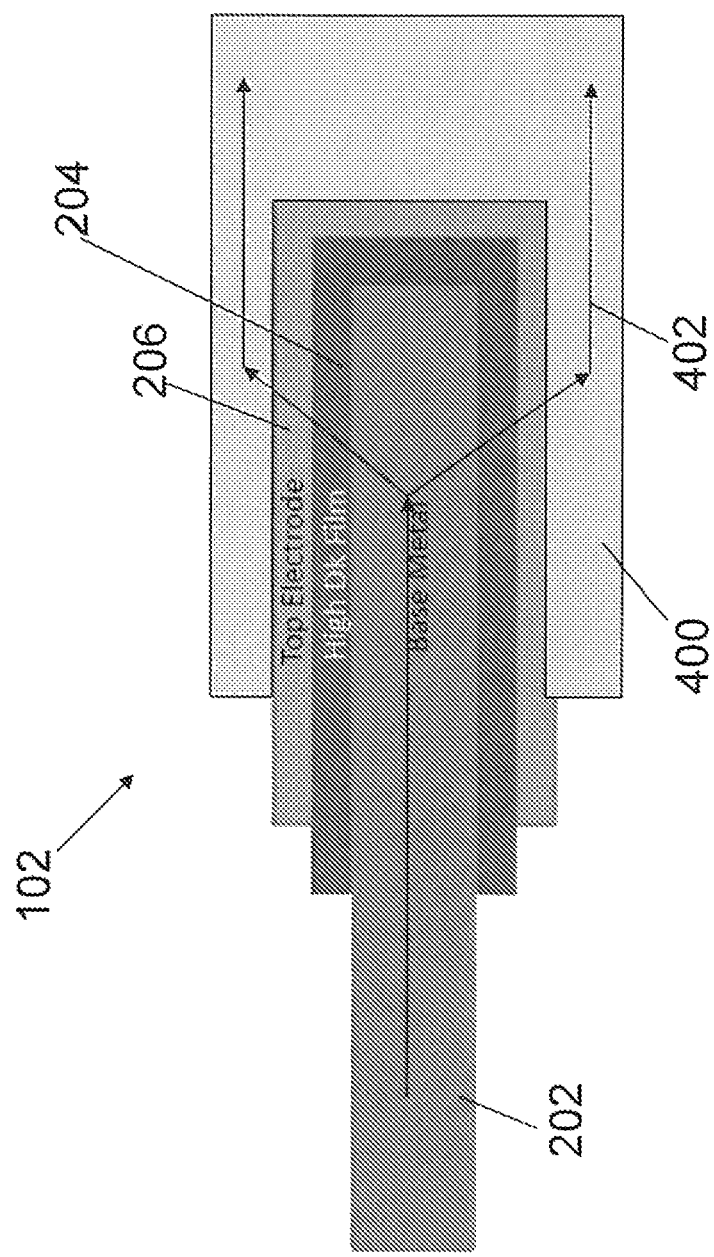
FIG. 4 illustrates a cross-sectional view of the contact assembly shown in FIG. 1 mated with a mating contact in accordance with one embodiment.

FIG. 4 illustrates a cross-sectional view of the contact assembly 102 mated with a mating contact 400 in accordance with one embodiment. The mating contact 400 can represent a conductive body, such as a conductive female contact or a conductive via, that receives the contact assembly 102 to communicate data signals between the mating contact 400 and the contact assembly 102. As shown in FIG. 4, the mating contact 400 engages the conductive layer 206 of the contact assembly 102 to electrically couple the mating contact 400 and the contact assembly 102.

Data signals may be communicated from the contact assembly 102 to the mating contact 400 along a signal propagation path 402 that extends through the composite layer 204 of the contact assembly 102 from the conductive layer 206 to the conductive substrate 202. Alternatively or additionally, data signals may be communicated in an opposite direction from the mating contact 400 to the contact assembly 102 and across the composite layer 204. The data signals flow through the composite layer 204 of the contact assembly 102 between the conductive layer 206 and the conductive substrate 202 such that the data signals pass through a capacitive element formed by the conductive substrate 202, the composite layer 204, and the conductive layer 206.

The capacitive element may filter the data signals such that the contact assembly 102 both communicates data signals of certain frequencies and filters the data signals of other certain frequencies or DC (e.g., direct current). The contact assembly 102 may filter out (e.g., block communication of) noise and/or DC signals from relatively high speed signals that are communicated along the signal propagation path 402. By way of example only, the contact assembly 102 may act as a high pass filter that filters out signals communicated at a frequency below a cutoff frequency of the contact assembly 102. The contact assembly 102 may permit the signals communicated at frequencies above the cutoff frequency to be communicated along the signal propagation path 402 while preventing signals transmitted at lower frequencies or DC from passing along the signal propagation path 402. In another example, the contact assembly 102 may act as a low pass filter that filters out signals communicated at a frequency above a cutoff frequency of the contact assembly 102. The contact assembly 102 may permit the signals communicated at frequencies below the cutoff frequency to be communicated along the signal propagation path 402 while preventing signals transmitted at higher frequencies to pass along the signal propagation path 402.

As the contact assembly 102 includes an integrally formed capacitive element that includes the composite layer 204, the contact assembly 102 may effectively include a capacitive filter without significantly increasing the signal length over which the signals travel along the signal propagation path 402. Therefore, the contact assembly 102 may both communicate and filter signals without significantly impacting the time delay skew in the signals.

Figure 5:
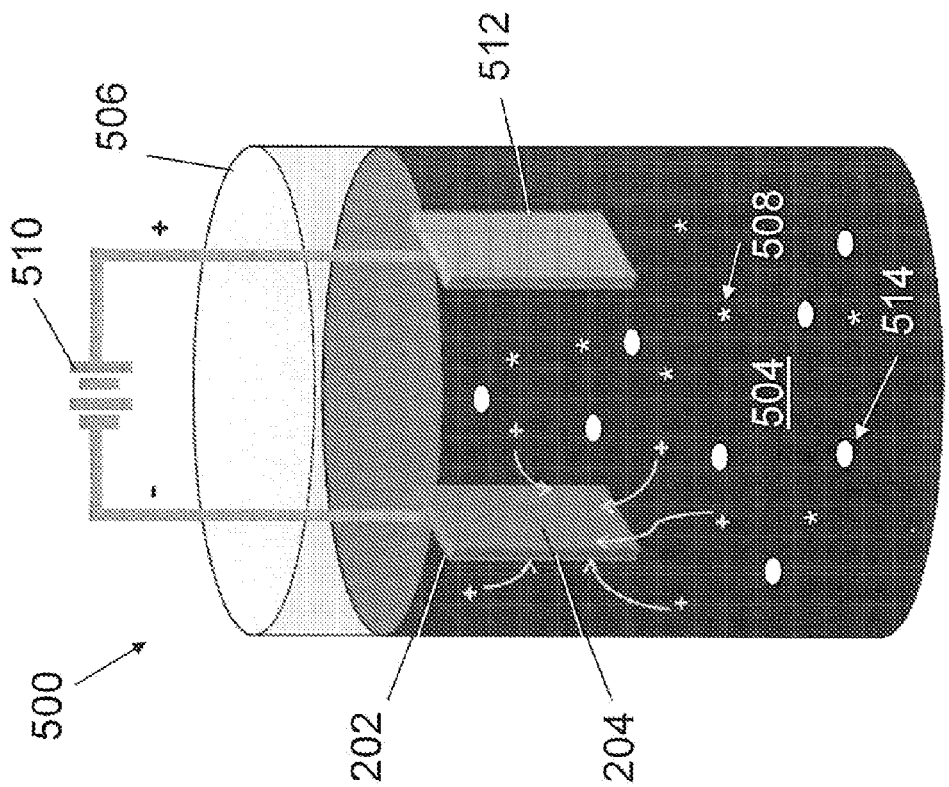
FIG. 5 is a diagram of an electrodepositing system in accordance with one embodiment.

FIG. 5 is a diagram of an electrodepositing system 500 in accordance with one embodiment. The electrodepositing system 500 is used to "electrocoat" or "e-coat" at least a portion of a conductive substrate 202. A fluid bath 504 is provided in a container 506. The fluid bath 504 may be a liquid bath formed from one or more dielectric materials 514 and/or one or more filler materials 508, and may be incorporated into a solvent medium. In one embodiment, the fluid bath 504 is formed from fluid or liquid monomers or polymers that may or may not be partially cured such as epoxy and/or acrylic materials. In another embodiment, the dielectric material includes a molten thermoplastic polymer or polymer which may be partially cross-linked. The fluid bath 504 includes filler material suspended in the fluid bath 504. The filler material 508 and the dielectric material 514 may be separately suspended in the fluid bath 504. For example, instead of the filler material 508 and the dielectric material 514 being chemically and/or physically combined in the fluid bath 504 (e.g., such as the dielectric material 514 forming a coating on the filler material 508 or the filler material forming a coating on the dielectric material 514), the filler material 508 and the dielectric material 514 may be separately suspended in the fluid bath 504. Alternatively, the fluid bath 504 may be a gaseous bath that includes the filler material 508 dispersed in gaseous form. For example, the fluid bath 504 may be a gas in a chemical vapor deposition (CVD), plasma-enhanced CVD (PECVD) or other type of vapor deposition chamber. In one embodiment, the filler material 508 is a conductive filler material, such as conductive particles of a metal, metal alloy, or conductive carbon (e.g., carbon black, graphene, carbon nanotubes, and the like).

The filler material 508 in the fluid bath 504 may have a relatively high conductivity characteristic. For example, the filler material 508 may conduct electric current with lower resistance than the dielectric material of the fluid bath 504. In one embodiment, the filler material 508 has an electrical conductivity characteristic of at least $6.30 \times 10^7$ Siemens per meter (S/m) at 20 degrees Celsius. Alternatively, the filler material 508 may have a different electrical conductivity characteristic, such as at least $5.96 \times 10^7$ S/m, $5.80 \times 10^7$ S/m, $4.10 \times 10^7$ S/m, and the like, at 20 degrees Celsius. In another embodiment, the filler material 508 may be particles or flakes of conductive carbon material. For example, the filler material 508 may include relatively small particles (e.g., having an average or median diameter of no greater than 30 nanometers) of carbon black. Alternatively, the filler material 508 may include larger particles.

The dielectric material 514 of the fluid bath 504 may have an electrical conductivity characteristic that is relatively small. For example, the conducitivity of the dielectric material 514 may be no greater than $1\times10^{-8}$ to $1\times10^{-12}$ S/m at 20 degrees Celsius. Alternatively, the dielectric material of the fluid bath 504 may have another electrical conductivity characteristic.

The conductive substrate 202 is at least partially inserted into the bath 504. For example, in an embodiment where the bath 504 is a liquid bath, the conductive substrate 202 may be lowered into the bath 504. Alternatively, in an embodiment where the bath 504 is a gaseous bath, the conductive substrate 202 may be placed into the container 506 that houses the gaseous bath.

The conductive substrate 202 is electrically coupled with a power source 510, such as a battery or electrical power supply. A conductive counter electrode 512 also is at least partially inserted into the bath 504. The counter electrode 512 is electrically coupled with the power source 510. The power source 510 applies a current across the conductive substrate 202 and the counter electrode 512. In the illustrated embodiment, the power source 510 applies a positive charge to the counter electrode 512 and a negative charge to the conductive substrate 202. Alternatively, a negative charge may be applied to the counter electrode 512 while a positive charge is applied to the conductive substrate 202. The voltage potential between the conductive substrate 202 and the counter electrode 512 and/or bath 504 causes the dielectric material 514 and the filler material 508 dispersed therein to be electrodeposited onto the conductive substrate 202. In the illustrated embodiment, the dielectric material 514 and filler material 508 are shown in the bath 504 as charged particles (e.g., by being shown by the symbols "+"). In one example, the negatively charged conductive substrate 202 attracts the dielectric material of the bath 504 (e.g., the polymer materials) and the filler material 508 toward the conductive substrate 202.

In one embodiment, both the dielectric material of the bath 504 and the filler material 508 are co-electrodeposited onto the conductive substrate 202 as an electrodeposited composite layer 204. For example, the dielectric material of the bath 504 and the conductive filler material 506 may be simultaneously or concurrently deposited on the conductive substrate 202.

The electrodeposition of the composite layer 204 onto the conductive substrate 202 may provide improved adhesion of the dielectric material of the bath 504 and the filler material 508 when compared to other techniques for applying the composite layer 204 to the conductive substrate 202. Additionally, the electrodeposition of the composite layer 204 may result in an approximately uniform or even distribution of the dielectric materials and filler material 406 throughout the composite layer 204. For example, the dispersion or distribution of the dielectric material of the bath 504 and the filler material 508 in the composite layer 204 may be approximately homogeneous.

Electrodeposition of the composite layer 204 also allows for relatively tight or close control over thicknesses of the composite layer 204. For example, by varying the current used to deposit the composite layer 204 and/or the time period over which the current is applied, the distance between electrodes (e.g., between the substrate 202 and the counter electrode 512, the concentration of the dielectric material 514 and filler particles 508 in the bath 504, and/or the temperature of the bath 504, the thickness of the composite layer 204 can be relatively closely controlled.

After the composite layer 204 has been provided on the conductive substrate 202, one or more additional conductive layers, such as the conductive layer 206 (shown in FIG. 2), may be deposited on the composite layer 204. In one embodiment, the conductive substrate 202 and composite layer 204 are placed into another bath (not shown) having a solution that includes a conductive material, such as metal or metal alloy ion or particles. A current may be applied between the conductive substrate 202 and the counter electrode 512 in order to electrodeposit the conductive layer 206 onto the composite layer 204. The electrodeposition of alternating conductive layers and composite layers 204 may be repeated to form multi-layered structures with alternating layers of composite layers 204 and conductive layers 206.

Figure 6:
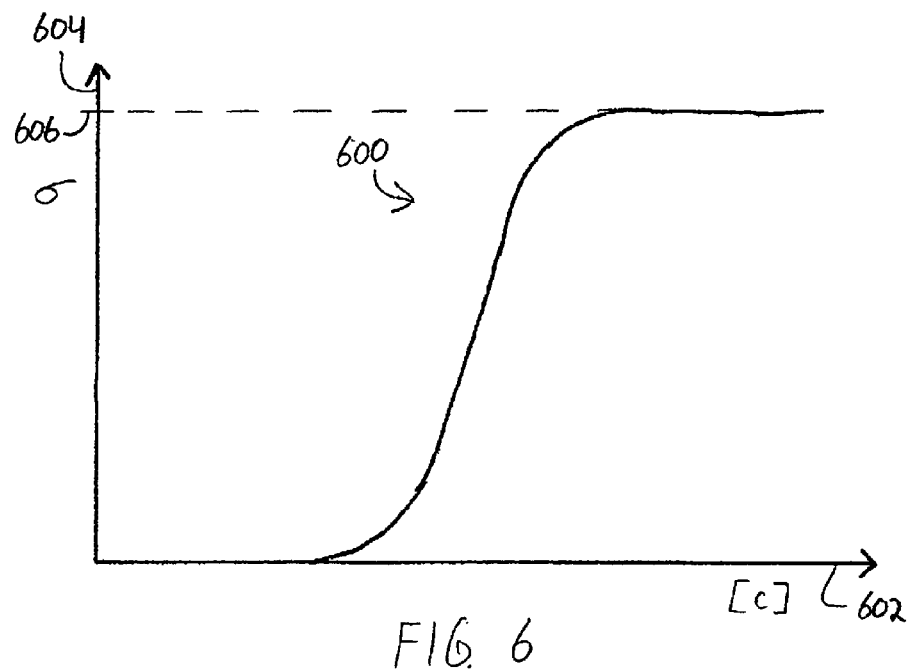
FIG. 6 is a representation of an electrical conductivity characteristic (a) of a composite layer shown in FIG. 2 for different concentrations [c] of a filler material shown in FIG. 5 in accordance with one embodiment.

FIG. 6 is a representation 600 of an electrical conductivity characteristic ($\sigma$) of the composite layer 204 (shown in FIG. 2) for different concentrations [c] of the filler material 508 (shown in FIG. 5) in accordance with one embodiment. The representation 600 is shown alongside a horizontal axis 602 representative of concentration of the filler material 508 in the composite layer 204 and a vertical axis 604 representative of the electrical conductivity of the composite layer 204. The representation 600 is provided as one example and is not intended to be limiting on all embodiments and/or all materials that may be used for the filler material 508.

As shown in FIG. 6, the conductivity of the composite layer 204 (shown in FIG. 2) is relatively low for low concentrations of the filler material 508 (shown in FIG. 5) in the composite layer 204, and increases to a potential upper limit or assymtote 606 at larger concentrations of the filler material 508. As a result, the composite layer 204 may become more conductive when more filler material 508 is added to the composite layer 204. For example, increasing the concentration of the filler material 508 in the fluid bath 504 (shown in FIG. 5) may increase the conductivity of the composite layer 204.

However, in order to avoid forming the composite layer 204 (shown in FIG. 2) as a conductive layer (e.g., to keep the composite layer 204 as the dielectric layer in a capacitor formed by the conductive substrate 202, the composite layer 204, and the conductive layer 206 shown in FIG. 2), the concentration of the filler material 508 is reduced so that the conductivity of the composite layer 204 is not at the upper limit 606. In one embodiment, the concentration of the filler material 508 is reduced below a percolation threshold concentration.

Figure 7:
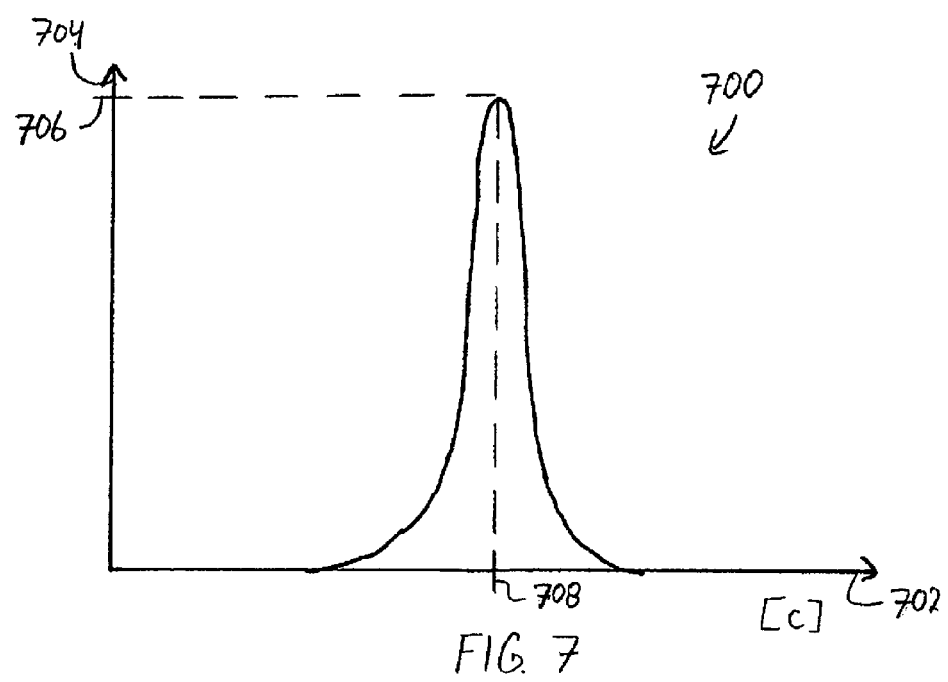
FIG. 7 is a representation of one example of a rate of change in the electrical conductivity characteristic (σ/[c]) for different concentrations [c] of the filler material shown in FIG. 5 in a composite layer shown in FIG. 2.

FIG. 7 is a representation 700 of one example of a rate of change in the electrical conductivity characteristic ($\sigma/[c]$) for different concentrations [c] of the filler material 508 (shown in FIG. 5) in the composite layer 204 (shown in FIG. 2). For example, the representation 700 may be a mathematical derivative of the representation 600 shown in FIG. 6. Alternatively, the representation 700 may have a different shape. The representation 700 shown in FIG. 7 is not intended to be limiting on all embodiments of the presently described subject matter. For example, different materials for the filler material 506 and/or the dielectric material of the fluid bath 504 (shown in FIG. 5) may have different representations 600 and/or 700.

The representation 700 is shown alongside a horizontal axis 702 representative of concentration of the filler material 508 (shown in FIG. 5) in the composite layer 204 (shown in FIG. 2) and a vertical axis 704 representative of the effective dielectric constant ($Dk_{eff}$) of the composite layer 204 or the capacitance of the composite assembly 200 that includes the composite layer 204. As shown in FIG. 7, the rate of change in the conductivity of the composite layer 204 increases to an upper limit 706 at lower concentrations of the filler material and then decreases for greater concentrations of the filler material 508. The concentration of the filler material 508 that corresponds to the upper limit 706 of the rate of change of conductivity may be referred to as a percolation threshold concentration 708.

With respect to FIGS. 6 and 7, the percolation threshold concentration 708 can represent the concentration of the filler material 506 (shown in FIG. 5) in the composite layer 204 (shown in FIG. 2) that, any increase or decrease in filler concentration from the concentration at the maximum derivative to another increased or decreased concentration will yield a substantial change (e.g., the most dramatic change relative to other concentrations of the filler material 506) in conductivity. For example, when the concentration of the filler material 506 is less than the percolation threshold concentration 708, the composite layer 204 can block the flow of a direct current (DC) that is applied across the composite layer 204, such as when the DC is applied across the conductive layer 206 and the conductive substrate 202. When the concentration of the filler material 506 is at or above the percolation threshold concentration 708, the composite layer 204 acts as a conductor and conducts the DC current between the conductive layer 206 and the conductive substrate 202.

In the illustrated examples, the percolation threshold concentration 708 may be the concentration of the filler material 508 at a greater derivative value of the representation 600 than one or more other derivative values. For example, the percolation threshold concentration 708 may occur at the maximum derivative of the representation 600 of conductivity versus concentration. Alternatively, the percolation threshold concentration 708 may occur at a different concentration.

The concentration of the filler material 508 (shown in FIG. 5) in the fluid bath 504 (shown in FIG. 5) may be established so that the concentration of the filler material 508 in the composite layer 204 (shown in FIG. 2) is slightly below the percolation threshold concentration 708. By "slightly below," it is meant that the concentration of the filler material 506 will be within a relatively small amount of the percolation threshold concentration 708, such as within 1%, 3%, 5%, 7%, 10%, 14%, 17%, or the like. In one embodiment, the concentration of the filler material 508 is lower than and within 10% of the percolation threshold concentration 708.

Establishing the concentration of the filler material 508 (shown in FIG. 5) to be within an amount that is slightly lower than the percolation threshold 708 provides unexpected results in terms of increased capacitance of a capacitive element formed by the conductive substrate 202, the composite layer 204, and the conductive layer 206 (all shown in FIG. 2). For example, the capacitance of the capacitive assemblies 200 (shown in FIG. 2) has been to unexpectedly increase in a non-linear manner with respect to increasing concentration of the filler material 508 up to a point below the percolation threshold concentration 708. The composite layers 204 formed in accordance with one or more embodiments described herein are found to exhibit relatively high effective dielectric constants (Dk), such as effective dielectric constants (Dk) that are at least 4.0. Alternatively, the effective dielectric constants (Dk) may be at least 3.0. Previously, when the concentration of a conductive filler material is increased, the expectation may be that the composite layer would become more conductive and act more as a conductor than a dielectric layer of a capacitive element and, as a result, cause a decrease in the dielectric constant (Dk) of the composite layer to below 3.0. The high effective dielectric constants (Dk) that are achieved by increasing the concentration of the filler material 508 up to a point just below the percolation threshold concentration 608 in accordance with one or more embodiments described herein are unexpected.

In one embodiment, the capacitance of a capacitive assembly 200 (shown in FIG. 2) having a copper conductive substrate 202 and conductive layer 206, and a composite layer 204 (shown in FIG. 2) formed from 86% epoxy or acrylic material and 14% carbon black particles as the filler material 508 (have an average or median size of no less than 10 and no greater than 30 nanometers) is found to be unexpectedly larger than the capacitance of capacitive assemblies 200 having larger or smaller concentrations of the filler material 506. In another embodiment, the capacitance of a capacitive assembly 200 having a copper conductive substrate 202 and conductive layer 206, and a composite layer 204 formed from 83.3% epoxy or acrylic material and 16.7% carbon black particles as the filler material 506 (have an average or median size of no less than 10 and no greater than 30 nanometers) is found to be unexpectedly larger than the capacitance of capacitive assemblies 200 having concentrations of the filler material 506 other than 14%.

In another embodiment, the capacitance of a capacitive assembly 200 having a copper conductive substrate 202 and conductive layer 206, and a composite layer 204 formed from 84 to 85% epoxy or acrylic material and 15 to 16% carbon black particles as the filler material 506 (have an average or median size of no less than 10 and no greater than 30 nanometers) is found to be unexpectedly larger than the capacitance of capacitive assemblies 200 having concentrations of the filler material 506 other than 14% or 16.7%.

In another embodiment, the capacitance of a capacitive assembly 200 having a copper conductive substrate 202 and conductive layer 206, and a composite layer 204 formed from 83 to 86% epoxy or acrylic material and 14 to 17% carbon black particles as the filler material 506 (have an average or median size of no less than 10 and no greater than 30 nanometers) is found to be unexpectedly larger than the capacitance of capacitive assemblies 200 having concentrations of the filler material 506 other than 14%, 16.7%, or 15 to 16%.

In another embodiment, the capacitance of a capacitive assembly 200 having a copper conductive substrate 202 and conductive layer 206, and a composite layer 204 formed from 81 to 88% epoxy or acrylic material and 6 to 19% carbon black particles as the filler material 406 (have an average or median size of no less than 10 and no greater than 30 nanometers) is found to be unexpectedly larger than the capacitance of capacitive assemblies 200 having concentrations of the filler material 506 other than 14%, 16.7%, 15 to 16%, or 14 to 17%.

In another embodiment, a conductive material other than carbon black may be used as the filler material 508 (shown in FIG. 5). For example, particles of gold, silver, platinum, and the like, may be used as the filler material 508. Alternatively, a metal oxide may be used as the filler material 508.

Figure 8:
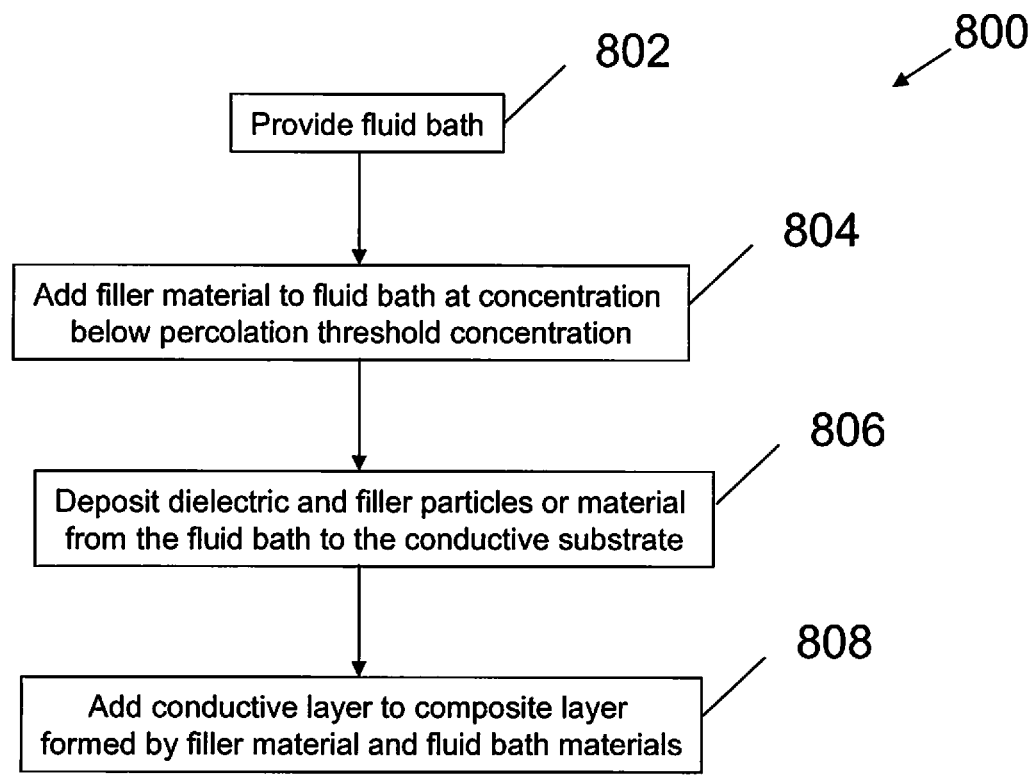
FIG. 8 is a flowchart of a method for providing a composite layer on a conductive substrate in accordance with one embodiment.

FIG. 8 is a flowchart of a method 800 for providing a composite layer on a conductive substrate in accordance with one embodiment. The method 800 may be used in connection with manufacturing a composite assembly for an electrical connector, such as the composite assembly 200 (shown in FIG. 2).

At 802, a fluid bath is provided. The fluid bath includes a dielectric material in a liquid or fluid state or as dielectric particles in a suspension. For example, the fluid bath may include or be formed from a liquid epoxy or acrylic material as well as a molten or partially cured or otherwise modified polymer.

At 804, a filler material is added to the fluid bath. The filler material may be a conductive material, such as silver, gold, platinum, carbon black, and the like. The filler material can be provided in relatively small particles or flakes, such as particles that are no larger than 30 nanometers in average diameter. The filler material can be added to the fluid bath until the concentration of the filler material is within a designated range of the percolation threshold concentration of the fluid bath. For example, the filler material can be added to the fluid bath until the concentration of the filler material is lower than the percolation threshold concentration, but is within 5% of the percolation threshold concentration. Alternatively, the filler material can be provided at another concentration that is lower than the percolation threshold concentration.

At 806, the fluid bath with the filler material is applied to an outer surface of a conductive substrate or body. For example, the fluid bath and filler material may be electrodeposited onto, molded onto, extruded into a shape that surrounds, laminated onto, sprayed onto, or printed onto the conductive substrate 202, as described above. The fluid bath and filler material cures, dries, or otherwise changes into a solid state to form a composite layer on the conductive substrate. For example, the fluid bath and filler material may form the composite layer 204 (shown in FIG. 2).

At 808, a conductive layer is provided on the composite layer. For example, the conductive layer 206 (shown in FIG. 2) may be deposited onto a side of the composite layer 204 (shown in FIG. 2) that is opposite of the side of the composite layer 204 that engages the conductive body 202 (shown in FIG. 2). As shown in FIG. 2, the conductive bodies (e.g., the conductive substrate 202 and the conductive layer 206) are on opposite sides of the composite layer 204 and are separated by the composite layer 204 so as to form a capacitive element. Electric current can flow into the contact assembly 102 (shown in FIG. 1) that includes the composite layer 204 from the conductive layer 206 and across the composite layer 204 to the conductive substrate 202, as described above.

Figure 9:
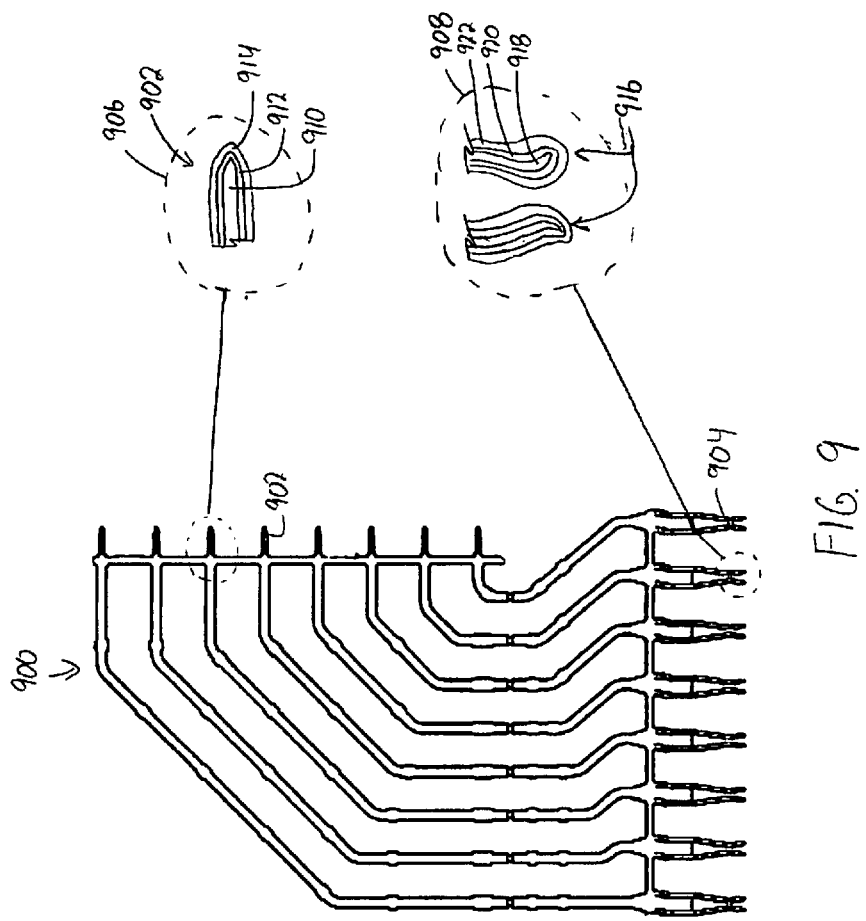
FIG. 9 is an illustration of a connector that includes one or more contacts that include capacitive elements formed in accordance with one or more embodiments described herein.

FIG. 9 is an illustration of a connector 900 that may include one or more contacts 902, 904 that include capacitive elements formed in accordance with one or more embodiments described herein. The connector 900 is illustrated as the conductive components of a backplane connector, such as the conductive signal traces in a chicklet of the connector 100 shown in FIG. 1. Alternatively, the connector 900 may be another type of connector. The contacts 902, 904 also are shown in FIG. 9 in corresponding insets 906, 908.

The contacts 902 are shown as pins having a conductive body or core 910 and a composite layer 912 forming a coating on the body 910. The composite layer 912 may be similar to the composite layer 204 (shown in FIG. 2) described above. A conductive layer 914 may be formed onto the composite layer 912, similar to the conductive layer 206 (shown in FIG. 2). The sequential layering of the composite layer 912 and the conductive layer 914 onto the body 910 creates a pin that includes a capacitive element. Signals that are communicated through the contact 902 travel through the body 910 and across the composite layer 912 to the conductive layer 914 to to another conductive body (e.g., a receptacle) to which the contact 902 is mated, or travel through the conductive layer 914 and across the composite layer 912 to the body 910 from the conductive body to which the contact 902 is mated.

The contacts 904 are shown as opposing arms 916 that receive a mating contact (e.g., a pin) therebetween. Each of the arms 916 includes a conductive body or core 918 and a composite layer 920 forming a coating on the body 918. The composite layer 920 may be similar to the composite layer 204 (shown in FIG. 2). A conductive layer 922 may be formed onto the composite layer 920, similar to the conductive layer 206 (shown in FIG. 2). Similar to the contact 902, the layering of the composite layer 920 and the conductive layer 922 onto the body 918 creates capacitive elements. Signals that are communicated through the contact 904 can travel through the body 918 and across the composite layer 920 to the conductive layer 922 to a pin that is received between and engaged with the arms 916, or travel from the pin through the conductive layer 922 and across the composite layer 920 to the body 918. As described above, forming the capacitive elements as part of the contact 902, 904 through which signals propagate can provide a capacitor or capacitive-like element for the signal propagation path without adding additional components (e.g., capacitors) that are external to the contact.

Dimensions, types of materials, orientations of the various components, and the number and positions of the various components described herein are intended to define parameters of certain embodiments of the inventive subject matter, and are by no means limiting and are merely example embodiments. Many other embodiments and modifications within the spirit and scope of the claims will be apparent to one of ordinary skill in the art upon reviewing the above description. The scope of the subject matter described herein should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

What is claimed is:

1. A contact assembly for an electrical connector, the contact assembly comprising:
    a conductive substrate configured to form a conductive path of the electrical connector;
    a composite layer engaged to the conductive substrate, the composite layer including a dielectric material with a conductive filler material dispersed within the dielectric material at a concentration that is lower than a percolation threshold concentration of the composite layer; and
    a conductive layer engaged to the composite layer, wherein the conductive substrate, the composite layer, and the conductive layer form a capacitive element through which a signal propagation path between the conductive substrate and a mating contact that mates with the conductive layer passes.

2. The contact assembly of claim 1, wherein the percolation threshold concentration represents a concentration of the filler material in the composite layer such that, if the concentration of the filler material is increased by a first percentage amount above the percolation threshold amount, an electrical conductivity characteristic of the composite layer would increase by a larger, second percentage amount.

3. The contact assembly of claim 1, wherein the percolation threshold concentration represents a designated concentration of the filler material in the composite layer, the designated concentration of the filler material being associated with a first derivative value of a relationship between an electrical conductivity characteristic of the composite layer and different concentrations of the filler material, the first derivative value of the relationship being greater than one or more other derivative values of the curve.

4. The contact assembly of claim 3, wherein the first derivative value is a maximum derivative value of the relationship between the electrical conductivity characteristic of the composite layer and the concentration of the filler material.

5. The contact assembly of claim 1, wherein the concentration of the filler material is within 10% of the percolation threshold concentration.

6. The contact assembly of claim 1, wherein the dielectric material includes at least one of epoxy, acrylic, or other monomer, molten thermoplastic polymer, or polymer which may be partially cross-linked.

7. The contact assembly of claim 1, wherein the filler material includes at least one of gold, silver, platinum, or carbon black or other conductive particle.

8. The contact assembly of claim 1, wherein the dielectric material is epoxy, the filler material includes carbon black, and the concentration of the filler material is between 6 and 19% of the composite layer.

9. The contact assembly of claim 1, wherein the capacitive element filters data signals communicated along the signal propagation path between the conductive substrate and the mating connector.

10. The contact assembly of claim 1, wherein the capacitive element blocks direct current (DC) components of data signals communicated along the signal propagation path between the conductive substrate and the mating connector.

11. A contact assembly comprising:
a conductive substrate configured to form a conductive path of the electrical connector;
a composite layer engaged to the conductive substrate, the composite layer including a dielectric material with a conductive filler material dispersed within the dielectric material at a concentration that is lower than a percolation threshold concentration of the composite layer; and
a conductive layer engaged to the composite layer, wherein the conductive substrate, the composite layer, and the conductive layer filter data signals that are communicated between the conductive substrate and a mating contact that mates with the conductive layer.

12. The contact assembly of claim 11, wherein the percolation threshold concentration represents a concentration of the filler material in the composite layer that, if the concentration of the filler material is increased by a first percentage amount above the percolation threshold amount, an electrical conductivity characteristic of the composite layer would increase by a larger, second percentage amount.

13. The contact assembly of claim 11, wherein the percolation threshold concentration represents a designated concentration of the filler material in the composite layer, the designated concentration of the filler material being associated with a first derivative value of a relationship between an electrical conductivity characteristic of the composite layer and different concentrations of the filler material, the first derivative value of the relationship being greater than one or more other derivative values of the curve.

14. The contact assembly of claim 13, wherein the first derivative value is a maximum derivative value of the relationship between the electrical conductivity characteristic of the composite layer and the concentration of the filler material.

15. The contact assembly of claim 11, wherein the concentration of the filler material is within 10% of the percolation threshold concentration.

16. The contact assembly of claim 11, wherein the dielectric material includes at least one of epoxy, acrylic, or other monomer or molten or partially cured polymer.

17. The contact assembly of claim 11, wherein the filler material includes at least one of gold, silver, platinum, or carbon black or other conductive filler particle.

18. The contact assembly of claim 11, wherein the dielectric material is epoxy, the filler material includes carbon black, and the concentration of the filler material is between 6 and 19% of the composite layer.

19. A method comprising:
providing a dielectric material;
dispersing a conductive filler material in the dielectric material;
applying the conductive filler material and the dielectric material onto a conductive substrate to deposit a composite layer formed from the dielectric material and the conductive filler onto the conductive substrate; and
depositing a conductive layer on the composite layer, wherein the conductive substrate, the composite layer, and the conductive layer form a capacitive element through which a signal propagation path between the conductive substrate and a mating contact that mates with the conductive layer passes, and wherein the conductive filler material is added to the dielectric material such that a concentration of the conductive filler in the composite layer that is deposited onto the conductive substrate is lower than a percolation threshold concentration of the composite layer.

20. The method of claim 19, wherein the percolation threshold concentration represents a concentration of the filler material in the composite layer that, if the concentration of the filler material is increased by a first percentage amount above the percolation threshold amount, an electrical conductivity characteristic of the composite layer would increase by a larger, second percentage amount.

21. The method of claim 19, wherein the percolation threshold concentration represents a designated concentration of the filler material in the composite layer, the designated concentration of the filler material being associated with a first derivative value of a relationship between an electrical conductivity characteristic of the composite layer and different concentrations of the filler material, the first derivative value of the relationship being greater than one or more other derivative values of the curve.

22. The method of claim 19, wherein applying the conductive filler material and the dielectric material to the conductive substrate includes at least one of electrocoating the conductive filler material and the dielectric material on the conductive substrate, dip coating the conductive filler material and the dielectric material on the conductive substrate, laminating the conductive filler material and the dielectric material on the conductive substrate, spraying the conductive filler material and the dielectric material on the conductive substrate, molding the conductive filler material and the dielectric material on the conductive substrate, screen printing the conductive filler material and the dielectric material on the conductive substrate, spin coating the conductive filler material and the dielectric material on the conductive substrate, or depositing the conductive filler material and the dielectric material on the conductive substrate using physical vapor deposition.

* * * * *